United States Patent
Liu

(10) Patent No.: US 12,051,600 B2
(45) Date of Patent: Jul. 30, 2024

(54) MATERIAL PROCESSING APPARATUS AND OPERATING METHOD THEREOF

(71) Applicant: Shao-Chi Liu, Kaohsiung (TW)

(72) Inventor: Shao-Chi Liu, Kaohsiung (TW)

(*) Notice: Subject to any disclaimer, the term of this patent is extended or adjusted under 35 U.S.C. 154(b) by 175 days.

(21) Appl. No.: 17/202,370

(22) Filed: Mar. 16, 2021

(65) Prior Publication Data

US 2022/0026939 A1 Jan. 27, 2022

Related U.S. Application Data

(60) Provisional application No. 63/056,725, filed on Jul. 27, 2020.

(30) Foreign Application Priority Data

Sep. 3, 2020 (TW) ................. 109130118

(51) Int. Cl.
  *G05D 27/02* (2006.01)
  *G05D 16/00* (2006.01)
  (Continued)

(52) U.S. Cl.
  CPC ..... *H01L 21/67092* (2013.01); *G05D 16/028* (2019.01); *G05D 23/1919* (2013.01); *G05D 27/02* (2013.01); *B01J 3/04* (2013.01)

(58) Field of Classification Search
  CPC ......... H01L 21/67092; H01L 21/67248; H01L 21/67253; H01L 21/67109;
  (Continued)

(56) References Cited

U.S. PATENT DOCUMENTS 8,828,309 B2 * 9/2014 Ashida ................ B29C 35/007
                                                      264/40.3
9,385,260 B2 * 7/2016 Lin ..................... H01L 31/0322
  (Continued)

FOREIGN PATENT DOCUMENTS

CN      1534342     10/2004
JP      S6228228     2/1987
  (Continued)

OTHER PUBLICATIONS

"Office Action of Japan Counterpart Application", issued on Jun. 2, 2022, p. 1-p. 3.
  (Continued)

*Primary Examiner* — Robert E Fennema
*Assistant Examiner* — Olvin Lopez Alvarez
(74) *Attorney, Agent, or Firm* — JCIP GLOBAL INC.

(57) ABSTRACT

A material processing apparatus including a processing chamber, an external pressure source, a pressure reducer, a temperature regulator, and a controller is provided. The processing chamber has an internal space. The external pressure source is connected to the processing chamber to pressurize the internal space. The pressure reducer is connected to the processing chamber to depressurize the internal space. The temperature regulator is arranged in the processing chamber to adjust the temperature in the internal space. The controller is configured to control the external pressure source and the temperature regulator to respectively increase the temperature to a first predetermined temperature and the pressure to a first predetermined pressure, and to control the pressure in the processing chamber to rise continuously before the temperature in the processing chamber rises to the first predetermined temperature. An operating method of a material processing apparatus is further provided.

16 Claims, 4 Drawing Sheets

(51) Int. Cl.
*G05D 23/19* (2006.01)
*H01L 21/67* (2006.01)
*B01J 3/04* (2006.01)

(58) Field of Classification Search
CPC ............ H01L 21/67011; G05D 16/028; G05D 23/1919; G05D 27/02; B01J 3/04
See application file for complete search history.

(56) References Cited

U.S. PATENT DOCUMENTS

| | | | |
|---|---|---|---|
| 10,328,615 B2* | 6/2019 | Ito | B29C 43/58 |
| 10,627,160 B2* | 4/2020 | Miura | F26B 3/06 |
| 2001/0009178 A1* | 7/2001 | Tamura | H01L 21/67109 |
| | | | 118/728 |
| 2003/0111459 A1* | 6/2003 | Nishimura | B23K 1/012 |
| | | | 219/628 |
| 2003/0175626 A1* | 9/2003 | Ryza | B08B 7/0021 |
| | | | 257/E21.228 |
| 2006/0102590 A1* | 5/2006 | Kevwitch | C11D 11/0047 |
| | | | 257/E21.255 |
| 2006/0223315 A1* | 10/2006 | Yokota | H01L 21/67115 |
| | | | 118/724 |
| 2013/0125797 A1* | 5/2013 | Hsiao | F27B 17/0025 |
| | | | 110/173 R |
| 2015/0047187 A1* | 2/2015 | Hung | H05K 3/305 |
| | | | 29/33 M |
| 2016/0056044 A1* | 2/2016 | Harada | C23C 16/45527 |
| | | | 438/763 |
| 2016/0203976 A1* | 7/2016 | Joda | H01L 21/02222 |
| | | | 438/781 |
| 2018/0249582 A1* | 8/2018 | Hung | H05K 3/305 |
| 2020/0392625 A1* | 12/2020 | Takebayashi | H01L 21/67109 |
| 2022/0028706 A1* | 1/2022 | Liu | H01L 21/67092 |

FOREIGN PATENT DOCUMENTS

| | | | | |
|---|---|---|---|---|
| JP | S6228228 A | * | 2/1987 | ........... H05K 1/0393 |
| JP | H067665 | * | 8/1991 | ................ B01J 3/04 |
| JP | 2005302887 A | * | 10/2005 | ......... H01L 21/316 |
| TW | 200639348 | | 11/2006 | |
| TW | 200717070 | | 5/2007 | |
| TW | I325994 | | 6/2010 | |
| TW | 1745069 B | * | 11/2021 | ............. G05B 19/18 |
| WO | WO2007053016 | * | 5/2007 | ......... F27B 17/0025 |

OTHER PUBLICATIONS

"Office Action of Taiwan Counterpart Application", issued on May 17, 2021, p. 1-p. 7.
"Office Action of Taiwan Counterpart Application", issued on Jun. 30, 2021, p. 1-p. 9.

* cited by examiner

MATERIAL PROCESSING APPARATUS AND OPERATING METHOD THEREOF

CROSS-REFERENCE TO RELATED APPLICATION

This application claims the priority benefits of U.S. provisional application Ser. No. 63/056,725, filed on Jul. 27, 2020, and Taiwan application serial no. 109130118, filed on Sep. 3, 2020. The entirety of each of the above-mentioned patent applications is hereby incorporated by reference herein and made a part of this specification.

BACKGROUND

Technical Field

The disclosure relates to a processing apparatus and a manufacturing method, and in particular to a material processing apparatus and a manufacturing method.

Description of Related Art

Generally, in a process of manufacturing an electronic product, bubbles are commonly generated in a material to be processed. The bubbles decrease the reliability and yield of the electronic product. In an existing technology, temperature uniformity of a material is likely to be not good, so there may be an error between a measured temperature and an actual overall temperature of the material. As a result, related parameters may not be accurately switched and control accuracy may be compromised.

SUMMARY

The disclosure provides a material processing apparatus and an operating method thereof, which improve the reliability and yield of an electronic product.

The disclosure provides a material processing apparatus, including a processing chamber, an external pressure source, a pressure reducer, a temperature regulator, and a controller. The processing chamber has an internal space. The external pressure source is connected to the processing chamber, and is adapted for performing a pressurization action in the internal space. The pressure reducer is connected to the processing chamber, and is adapted for performing a depressurization action in the internal space. The temperature regulator is disposed in the processing chamber to adjust a temperature in the internal space. The controller is adapted for controlling the external pressure source and temperature regulator to respectively increase a temperature and a pressure in the processing chamber to a first predetermined temperature and a first predetermined pressure, and is adapted for controlling the pressure in the processing chamber to rise continuously before the temperature in the processing chamber rises to the first predetermined temperature.

In an embodiment of the disclosure, the material processing apparatus described above further includes at least one motor disposed outside the processing chamber and coupled to the processing chamber.

In an embodiment of the disclosure, the at least one motor described above is located in an atmospheric environment.

In an embodiment of the disclosure, the at least one motor described above is multiple motors, and a part of one of the motors extends into the processing chamber.

In an embodiment of the disclosure, the material processing apparatus described above further includes a turbofan disposed in the processing chamber and connected to the temperature regulator and one of the motors.

In an embodiment of the disclosure, the at least one motor described above is one motor, and there is a distance between the motor and the processing chamber.

In an embodiment of the disclosure, the material processing apparatus described above further includes a cooler disposed between the processing chamber and the pressure reducer to cool a gas extracted from the processing chamber.

In an embodiment of the disclosure, the controller described above is adapted for controlling the pressure in the processing chamber to be no less than a normal pressure.

In an embodiment of the disclosure, the controller is adapted for controlling the pressure reducer not to perform the depressurization action before the temperature rises to the first predetermined temperature described above.

An operating method of a material processing apparatus of the disclosure includes the following. The material processing apparatus described above is provided. An electronic product is placed into a processing chamber. A controller is operated to respectively increase the temperature and the pressure in the processing chamber to a first predetermined temperature and a first predetermined pressure. The controller is operated so that the pressure in the processing chamber rises continuously before the temperature in the processing chamber rises to the first predetermined temperature.

Based on the above, the controller controls the external pressure source and the temperature regulator, so as to respectively increase the temperature and the pressure in the processing chamber to the first predetermined temperature and the first predetermined pressure, and the controller controls the pressure in the processing chamber to rise continuously before the temperature rises to the first predetermined temperature. Thus, the temperature uniformity of the material (the center temperature of the material is similar to the edge temperature of the material) in the processing process of the electronic product is improved. In addition, the temperature uniformity is optimized by not reducing the pressure before the temperature rises to the first predetermined temperature, in order to reduce the error between the measured temperature and the overall temperature of the actual material. Accordingly, the material processing apparatus of the disclosure may accurately switch between related parameters, increase control accuracy, and improve the reliability and yield of the electronic product.

To further describe the features of the disclosure, embodiments accompanied with drawings are described below in details.

DESCRIPTION OF THE EMBODIMENTS

Figure 1:
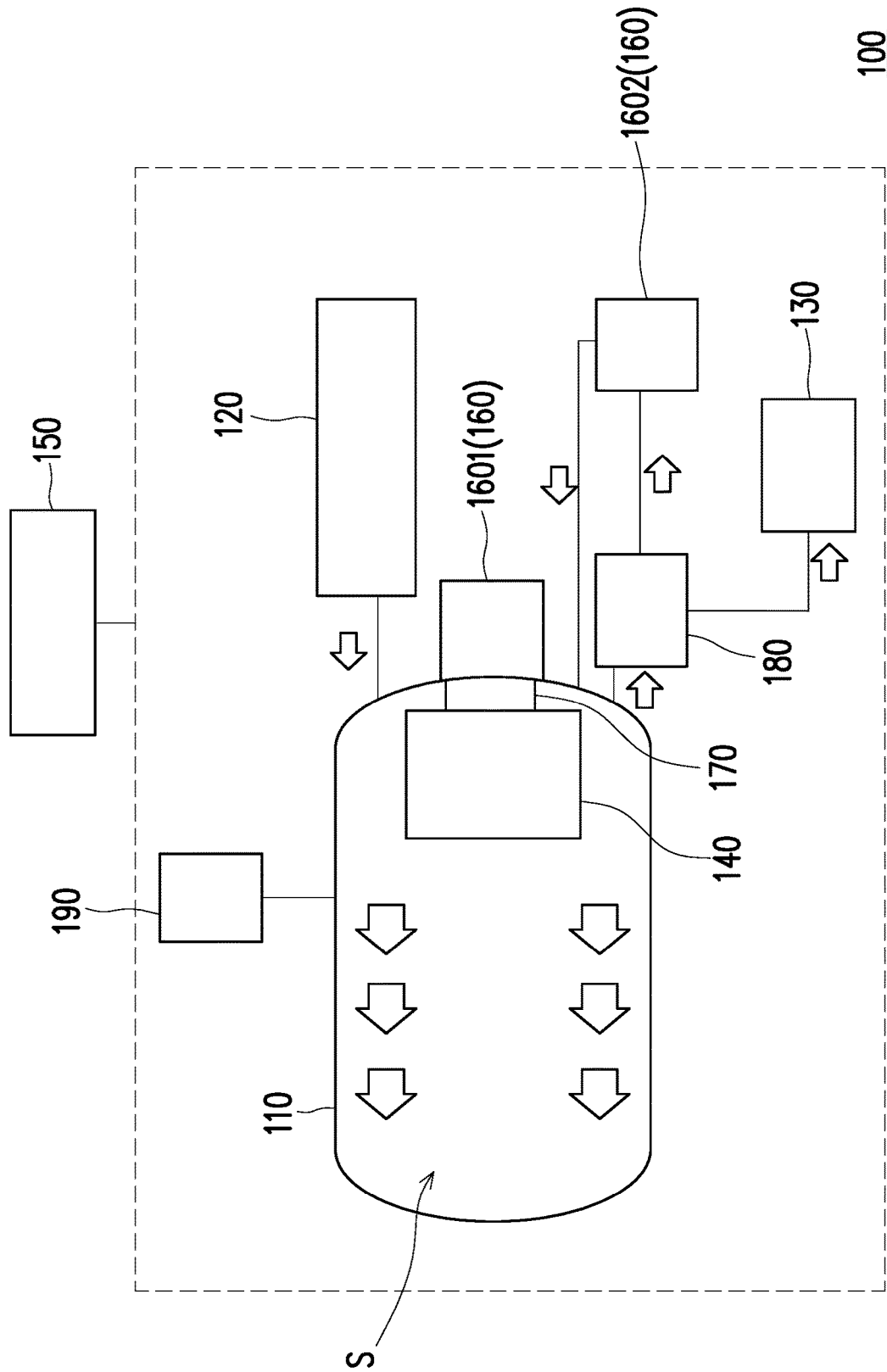
FIG. 1 is a block diagram of a material processing apparatus according to an embodiment of the disclosure.

FIG. 1 is a block diagram of a material processing apparatus according to an embodiment of the disclosure. The material processing apparatus herein is, for example, adapted for material processing in any related process (front end of line (FEOL), back end of line (BEOL), ball-level system-in-package (SiP), and chip-level chip-on-wafer) in the process of producing an electronic product. The electronic product may include but is not limited to an automotive electronic product and a sensing electronic product. The following description may be regarded as a processing process of an electronic product.

Referring to FIG. 1, a material processing apparatus 100 includes a processing chamber 110, an external pressure source 120, a pressure reducer 130, a temperature regulator 140, and a controller 150. In addition, the processing chamber 110 has an internal space S. The external pressure source 120 is connected to the processing chamber 110 and is adapted for performing a pressurization action in the internal space S. The pressurization action herein may be achieved by the following. The external pressure source 120 may provide a high pressure gas to the internal space S of the processing chamber 110, so that the pressure in the internal space S is greater than a normal pressure. However, the disclosure is not limited thereto. The external pressure source 120 may perform the pressurization action in the internal space S by any other suitable method. In some embodiments, the pressure in the internal space S may be set to be within a range of 1 atmosphere and 100 atmospheres through performing the pressurization action, but the disclosure is not limited thereto. It should be noted that the normal pressure mentioned in the disclosure is 1 atmosphere (atm).

The pressure reducer 130 is connected to the processing chamber 110 and is adapted for performing a depressurization action in the internal space S. The pressure reducer 130 herein may perform the depressurization action by using a pump to extract the gas in the internal space S, but the disclosure is not limited thereto. The depressurization action in the internal space S may be performed by any other suitable method.

The temperature regulator 140 is disposed in the processing chamber 110 and is adapted for adjusting the temperature in the internal space S. In this embodiment, the temperature regulator 140, for example, adjusts the temperature by circulating hot air in a convective method, so as to set a gas temperature in the internal space S to be uniform. However, the disclosure is not limited thereto. The temperature regulator 140 may perform a temperature adjustment by any other suitable method.

The controller 150 is at least adapted for controlling the external pressure source 120 and the temperature regulator 140. Specifically, the controller 150 may be adapted for controlling the external pressure source 120 and the temperature regulator 140 to respectively increase the temperature and the pressure in the processing chamber 110 to a first predetermined temperature and a first predetermined pressure, and the controller 150 may further be adapted for controlling the pressure in the processing chamber 110 to rise continuously before the temperature in the processing chamber 110 rises to the first predetermined temperature. In other words, the controller 150 may be adapted for controlling the pressure reducer 130 not to perform the depressurization action before the temperature rises to the first predetermined temperature. In some embodiments, the first predetermined temperature is, for example, a softening point of a material in a processing process of an electronic product, but the disclosure is not limited thereto.

Since the density of thermal molecules in the processing chamber 110 may be increased by performing the pressurization action in the processing chamber 110, so that the thermal molecules may uniformly heat the material in the processing process of the electronic product, the temperature uniformity of the material (the center temperature of the material is similar to the edge temperature of the material) in the processing process of the electronic product may be increased through the controller 150 controlling the pressure in the processing chamber to continuously rise before the temperature in the processing chamber 110 rises to the first predetermined temperature. By not reducing the pressure before the temperature rises to the first predetermined temperature, the temperature uniformity may be optimized, so that an error between a measured temperature and an overall temperature of an actual material is reduced. Accordingly, the material processing apparatus 100 of this embodiment may accurately switch between related parameters, increase control accuracy, and improve the reliability and yield of the electronic product.

The controller 150 may be a central processing unit (CPU), and other programmable general-purpose or special-purpose devices such as a microprocessor, a digital signal processor (DSP), a programmable controller, application specific integrated circuits (ASIC), a programmable logic device (PLD), a processing device similar to the devices described above, or a combination of the devices described above. The controller 150 may have an in-built or externally-connected memory.

In some embodiments, the controller 150 may be adapted for controlling the pressure in the processing chamber 110 to be no less than the normal pressure. In other words, the pressure in the processing chamber 110 may be maintained at a positive pressure.

In some embodiments, for example, the temperature and the pressure in the processing chamber 110 are respectively increased to the first predetermined temperature and the first predetermined pressure by using a linear increase method. However, the disclosure is not limited thereto. In other embodiments, for example, the temperature and the pressure in the processing chamber 110 are respectively increased to the first predetermined temperature and the first predetermined pressure by using a multi-stage method.

It should be noted that the disclosure may adjust the pressure (P), the temperature (T) and the time (t) according to material characteristics. As long as the controller 150 may be adapted for controlling the external pressure source 120 and the temperature regulator 140, so that the temperature and the pressure in the processing chamber 110 are respectively increased to the first predetermined temperature and the first predetermined pressure, and the controller 150 may be adapted for controlling the pressure in the processing chamber 110 to rise continuously before the temperature in the processing chamber 110 rises to the first predetermined temperature, the above all belong to the scope of protection of the disclosure.

In this embodiment, the material processing apparatus 100 may optionally include at least one motor 160. The motor 160 may be disposed outside the processing chamber 110 and be coupled to the processing chamber 110. In other words, the motor 160 may not be disposed in the internal space S. Therefore, compared with a motor that is disposed in the internal space S and thus has a pressure equal to the pressure in the internal space S, the motor 160 of this embodiment will not be damaged due to a pressure change in the internal space S, thereby having a longer service life. In some embodiments, the motor 160 may be coupled to the processing chamber 110 through a shaft or a pipe line or other suitable connectors, but the disclosure is not limited thereto.

In some embodiments, the motor 160 may be located in an atmospheric environment; that is, the motor 160 may be directly exposed to the air without being encapsulated by any casing, but the disclosure is not limited thereto. In other embodiment, the motor 160 may be encapsulated by a casing in order to avoid being damaged due to an impact of an external force.

In this embodiment, the material processing apparatus 100 may optionally include a turbofan 170, and the at least one motor 160 may be multiple motors 160. Specifically, a part of one of the motors 160 extends into the processing chamber 110, and the turbofan 170 may be disposed in the processing chamber 110 and connected with the temperature regulator 140 and one of the motors 160.

As shown in FIG. 1, the motor 160 may include a motor 1601 and a motor 1602, and a part of the motor 1601 extends into the processing chamber 110. In addition, the turbofan 170 may be disposed in the processing chamber 110 and connected with the temperature regulator 140 and the motor 1601. In other words, the turbofan 170 may be sandwiched between the temperature regulator 140 and the motor 1601. On the other hand, the motor 1602 may be coupled to the processing chamber 110 to be adapted for adjusting a gas content in the processing chamber 110. For example, when the gas content in the processing chamber 110 is high, the controller 150 may control the motor 1602 to extract the gas in the processing chamber 110, but the disclosure is not limited thereto.

In some embodiments, the motor 1601 may be a driving motor. Therefore, the motor 1601 may drive the turbofan 170 to rotate to set the gas temperature in the internal space S to be more uniform, but the disclosure is not limited thereto.

In this embodiment, the material processing apparatus 100 may optionally include a cooler 180. The cooler 180 may be disposed between the processing chamber 110 and the pressure reducer 130, and is adapted for cooling the gas extracted from the processing chamber 110. In addition, the cooler 180 may be disposed outside the processing chamber 110 and connected to the internal space S; therefore, the gas cooled by the cooler 180 may flow back to the processing chamber 110 for circulation. In some embodiments, the cooler 180 may be a plate heat exchanger, but the disclosure is not limited thereto. The cooler 180 may be any suitable cooling device.

In this embodiment, the material processing apparatus 100 may optionally include a gas content sensor 190. The gas content sensor 190 may be disposed outside the processing chamber 110 and connected to the internal space S. Specifically, the gas content sensor 190 may sense the content of a specific gas in the internal space S, and the gas content sensor 190 may have an adjustment unit (not shown). The adjustment unit may adjust a fluid to be suited for being sensed before the content of the specific fluid is sensed. For example, the adjustment unit is, for example, a valve, adapted for allowing a fluid with a proper flow rate to pass through to be sensed. Alternatively, the adjustment unit is, for example, a temperature adjustment unit, adapted for increasing or decreasing the temperature of the fluid so that the temperature of the fluid is adjusted to be within a range of a temperature suitable for being sensed.

In some embodiments, the gas content sensor 190 is, for example, an oxygen content analyzer. The type and forming unit(s) of the gas content sensor 190 and the type of gas sensed by the gas content sensor 190 are not limited by this.

It should be noted that, in addition to being adapted for controlling the external pressure source 120 and the temperature regulator 140, the controller 150 may further be optionally adapted for controlling the elements described above, including the pressure reducer 130, the motor 160, the cooler 180, the turbofan 170, and the gas content sensor 190, so as to have a more accurate and faster parameter switching mechanism, but the disclosure is not limited thereto.

It should be noted that in the following embodiment, the element numerals and part of the content of the embodiment described above are used. Same or similar elements are represented by the same or similar numerals, and descriptions of the same technical content are omitted. The embodiment described above may be referred to for the descriptions of the omitted parts, and the descriptions will not be repeated in the following embodiment.

Figure 2:
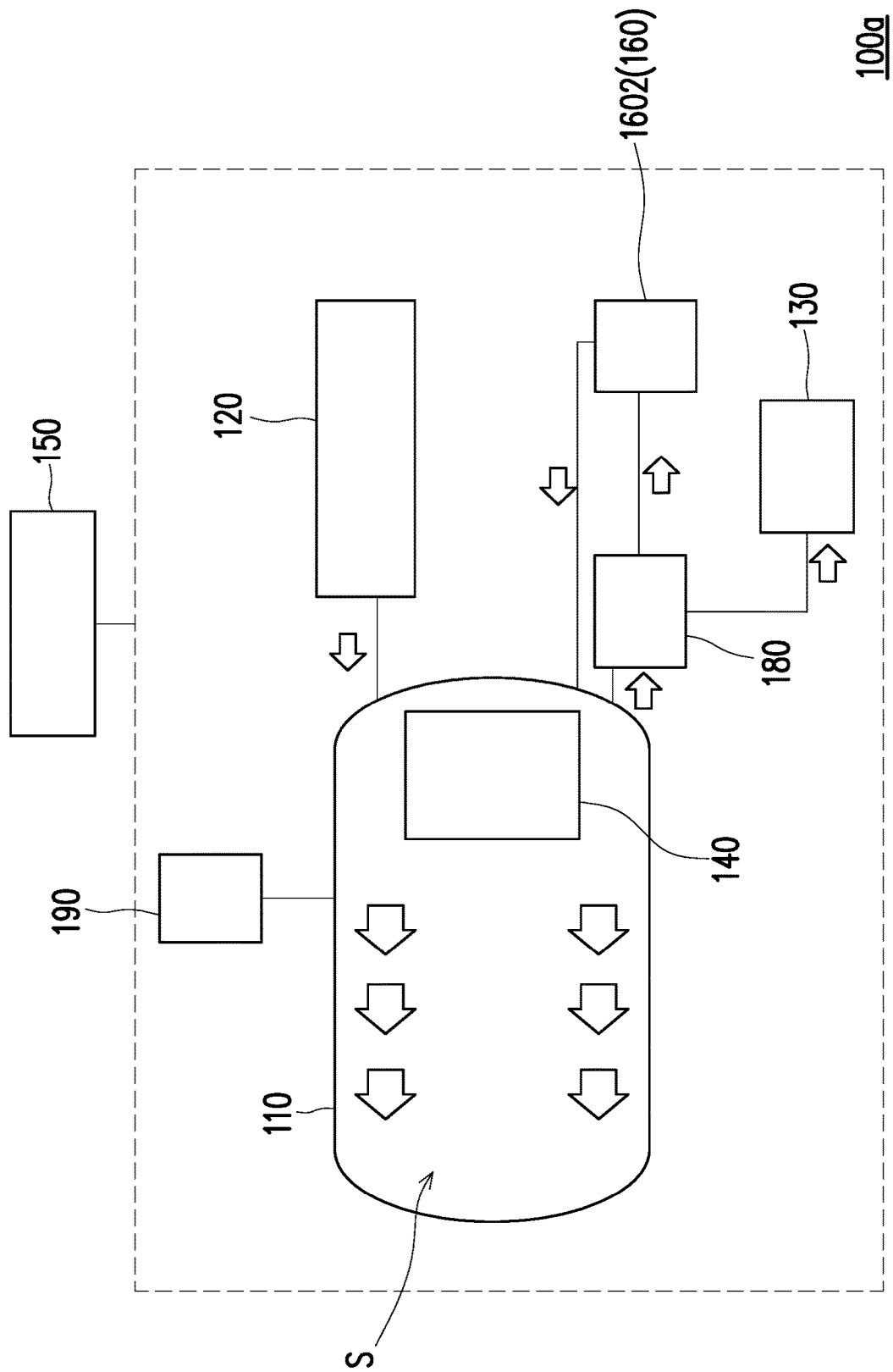
FIG. 2 is a block diagram of a material processing apparatus according to another embodiment of the disclosure.

FIG. 2 is a block diagram of a material processing apparatus according to another embodiment of the disclosure. Referring to FIG. 2, the differences between the material processing apparatus 100 of the embodiment of FIG. 1 and a material processing apparatus 100a of this embodiment are the following. The at least one motor 160 of the material processing apparatus 100a is one motor 160, and there is a distance between the motor 160 and the processing chamber 110. Furthermore, in this embodiment, the material processing apparatus 100a does not include the turbofan 170 and the motor 1601 that drives the turbofan 170. In addition, the motor 1602 may be connected to the cooler 180; therefore, the motor 1602 may directly adjust the gas in the processing chamber 110 and enable the gas cooled by the cooler 180 to flow back to the processing chamber 110 for circulation.

The disposition of the material processing apparatus 100a of this embodiment may reduce the number of the motor(s) that are used; therefore, the manufacturing cost of the material processing apparatus 100a may be reduced. However, the disclosure does not limit the number and location of the motor(s). The number and location of the motor(s) may be adjusted according to actual design needs.

Figure 3:
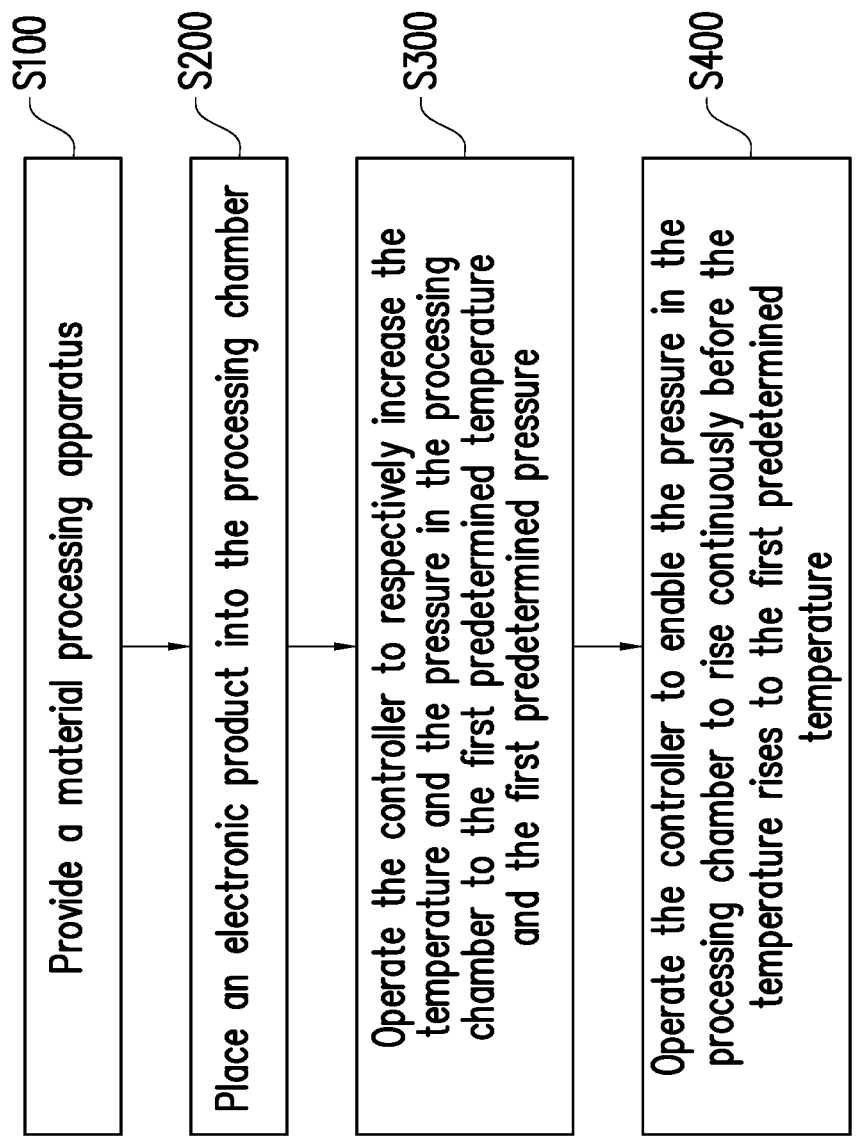
FIG. 3 is a flow chart of an operating method of a material processing apparatus according to an embodiment of the disclosure.

An operating method of a material processing apparatus according to an embodiment of the disclosure is illustrated with figures as follows. FIG. 3 is a flow chart of an operating method of a material processing apparatus according to an embodiment of the disclosure.

Referring to FIG. 3, in step S100, a material processing apparatus is provided, for example, the material processing apparatus 100 or the material processing apparatus 100a is provided. Next, in step S200, an electronic product is placed into the processing chamber 110. Next, in step S300, the controller 150 is operated to respectively increase the temperature and the pressure in the processing chamber 110 to the first predetermined temperature and the first predetermined pressure. Next, in step S400, the controller 150 is operated to enable the pressure in the processing chamber 110 to rise continuously before the temperature rises to the first predetermined temperature.

Figure 4:
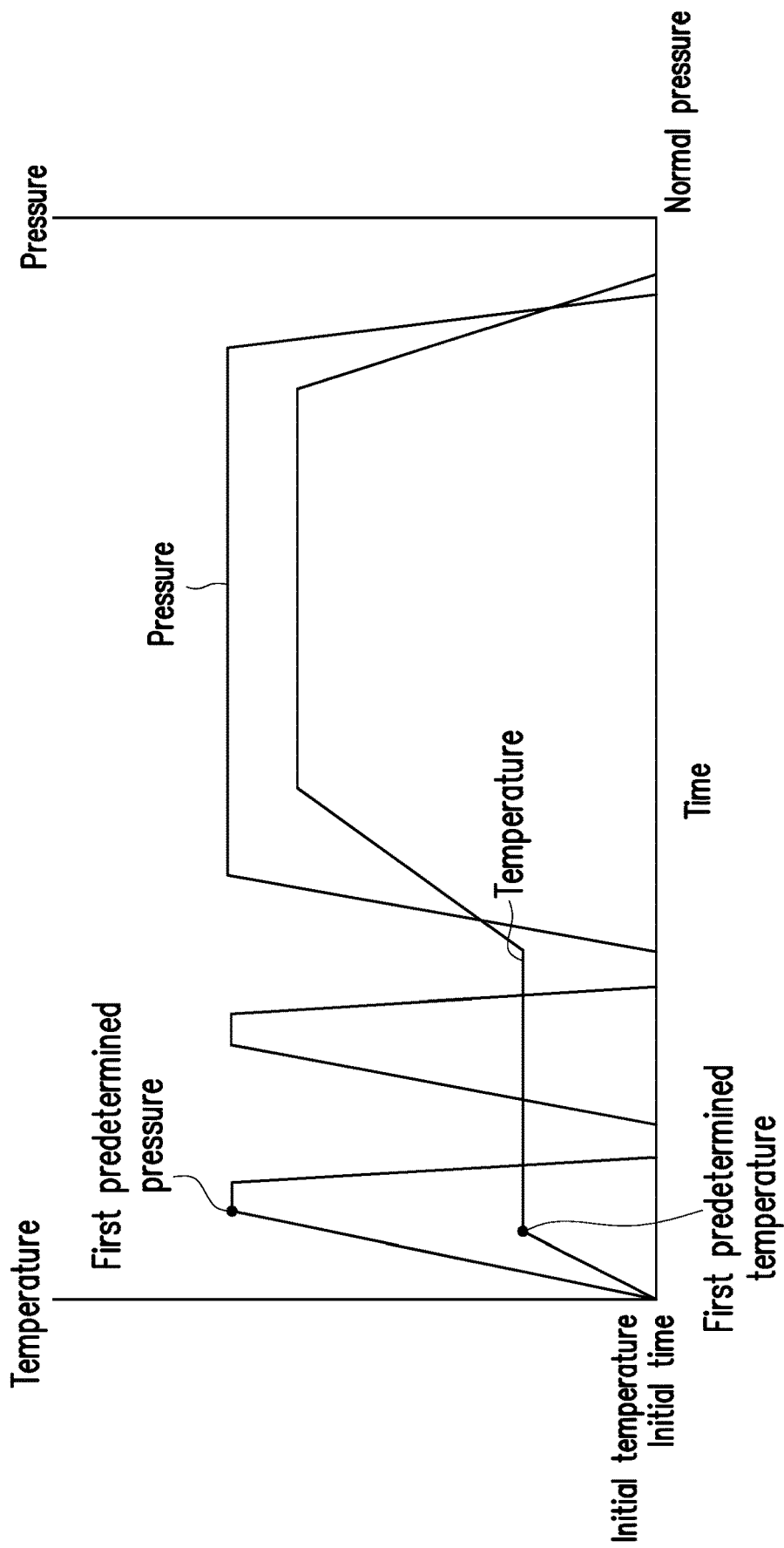
FIG. 4 is a graph of a relationship among temperature, pressure, and time according to some embodiments of the disclosure.

An operating curve in some embodiments of the disclosure is illustrated with figures as follows. FIG. 4 is a graph of a relationship among temperature, pressure, and time according to some embodiments of the disclosure.

Referring to FIG. 4, the operating curve in FIG. 4 illustrates material processing of a film bonding process, a two-stage thermosetting material (B-stage) bonding process, a die attach film (DAF) bonding process, an optically clear adhesive (OCA) bonding process, and a silver glue filling process in the process of manufacturing an electronic product. The material may be a material that can be applied to the above processes known to those skilled in the art, which will not be repeated herein.

When the material used in the processing process in manufacturing the electronic product is a dry film, or a solid, solid-like, or low-viscosity material as described above, the material processing apparatus of the disclosure may omit the vacuuming step. Accordingly, the steps may be simplified to reduce the manufacturing cost of the electronic product.

In addition, in the embodiment of FIG. 4, in an initial cooling process, the pressure may be maintained at a set value (the depressurization action is not performed). Therefore, in the initial cooling process, a warp generated due to a thermal reaction or bubbles returning to an original state may be prevented, and thus the reliability and yield of the electronic product may be further ensured.

It should be noted that the first predetermined pressure and first predetermined temperature marked in FIG. 4 only schematically show the curves related to the temperature, pressure, and time corresponding to the material characteristics of the material used in the processing process in manufacturing the electronic product. The actual values of the temperature, pressure, and time may be adjusted according to actual design needs. Therefore, the values of temperature, pressure, and time are not specifically indicated in FIG. 4. In addition, the first predetermined temperature and the first predetermined pressure may be respectively defined as a first highest point on the temperature curve and a first highest point on the pressure curve.

In addition, the relationship between the temperature and pressure is not limited to the curve illustrated in FIG. 4 (for example, the temperature and the pressure in the processing chamber 110 may be increased to the first predetermined temperature and the first predetermined pressure at the same time). That is, the timing of temperature adjustment and pressurization may be determined according to actual design needs. As long as the operating controller 150 may be adapted for controlling the external pressure source 120 and the temperature regulator 140, so that the temperature and the pressure in the processing chamber 110 are respectively increased to the first predetermined temperature and the first predetermined pressure, and the controller 150 may be adapted for controlling the pressure in the processing chamber to rise continuously before the temperature in the processing chamber 110 rises to the first predetermined temperature, the above all belong to the scope of protection of the disclosure.

For example, the pressure in the processing chamber 110 may be increased after the temperature is increased to a certain temperature. Alternatively, the temperature in the processing chamber 110 may be increased after the pressure in the processing chamber 110 is increased to a certain pressure.

In summary, the controller controls the external pressure source and the temperature regulator, so as to respectively increase the temperature and the pressure in the processing chamber to the first predetermined temperature and the first predetermined pressure, and the controller controls the pressure in the processing chamber to rise continuously before the temperature rises to the first predetermined temperature. Thus, the temperature uniformity of the material (the center temperature of the material is similar to the edge temperature of the material) in the processing process of the electronic product may be improved. In addition, by not reducing the pressure in the temperature-rising status, the temperature uniformity may be optimized, in order to reduce the error between the measured temperature and the overall temperature of the actual material. Accordingly, the material processing apparatus of the disclosure may accurately switch between related parameters, increase control accuracy, and improve the reliability and yield of the electronic product. In addition, when the material used in the processing process in manufacturing the electronic product is a dry film, or a solid, solid-like, or low-viscosity material, the material processing apparatus of the disclosure may omit the vacuuming step. Accordingly, the steps may be simplified to reduce the manufacturing cost of the electronic product.

Although the disclosure has been disclosed in the above by way of embodiments, the embodiments are not intended to limit the disclosure. Those with ordinary knowledge in the technical field can make various changes and modifications without departing from the spirit and scope of the disclosure. Therefore, the scope of protection of the disclosure is defined by the scope of the appended claims.

What is claimed is:

1. A material processing apparatus, comprising:
a processing chamber, having an internal space;
an external pressure source, connected to the processing chamber, adapted for performing a pressurization action in the internal space;
a pressure reducer, connected to the processing chamber, adapted for performing a depressurization action in the internal space;
a temperature regulator, disposed in the processing chamber, adapted for adjusting a temperature in the internal space; and
a controller, adapted for controlling the external pressure source and the temperature regulator to respectively increase a temperature and a pressure in the processing chamber to a first predetermined temperature by a first time and a first predetermined pressure by a second time, and the first time less than the second time, the temperature within the first time period rises continuously, the pressure within the second time period rises continuously, and adapted for controlling the pressure in the processing chamber to rise continuously before the temperature in the processing chamber rises to the first predetermined temperature, wherein:
a rising slope of the pressure within the second time period is greater than a rising slope of the temperature within the first time period; and
after reaching the first predetermined temperature and maintaining the first predetermined temperature during a third time, the first predetermined temperature in the processing chamber further rises to a second predetermined temperature; and
a cooler, disposed between the processing chamber and the pressure reducer, adapted for cooling a gas extracted from the processing chamber, wherein the gas cooled by the cooler is configured to flow back to the processing chamber for circulation.

2. The material processing apparatus according to claim 1, further comprising at least one motor, disposed outside the processing chamber and coupled to the processing chamber.

3. The material processing apparatus according to claim 2, wherein the at least one motor is located in an atmospheric environment.

4. The material processing apparatus according to claim 2, wherein the at least one motor is a plurality of motors, and a part of one of the motors extends into the processing chamber.

5. The material processing apparatus according to claim 4, further comprising a turbofan, disposed in the processing chamber and connected to the temperature regulator and one of the motors.

6. The material processing apparatus according to claim 2, wherein the at least one motor is one motor, and there is a distance between the motor and the processing chamber.

7. The material processing apparatus according to claim 1, wherein the controller is adapted for controlling the pressure in the processing chamber to be no less than a normal pressure.

8. The material processing apparatus according to claim 1, wherein the controller is adapted for controlling the pressure reducer not to perform the depressurization action before the temperature in the processing chamber rises to the first predetermined temperature.

9. An operating method of a material processing apparatus, comprising:
providing the material processing apparatus, wherein the material processing apparatus comprises:
a processing chamber, having an internal space;
an external pressure source, connected to the processing chamber, adapted for performing a pressurization action in the internal space;
a pressure reducer, connected to the processing chamber, adapted for performing a depressurization action in the internal space;
a temperature regulator, disposed in the processing chamber, adapted for adjusting a temperature in the internal space; and
a controller, adapted for controlling the external pressure source and the temperature regulator to respectively increase a temperature and a pressure in the processing chamber to a first predetermined temperature by a first time and a first predetermined pressure by a second time, and the first time less than the second time, the temperature within the first time period rises continuously, the pressure within the second time period rises continuously, and adapted for controlling the pressure in the processing chamber to rise continuously before the temperature in the processing chamber rises to the first predetermined temperature, wherein:
a rising slope of the pressure within the second time period is greater than a rising slope of the temperature within the first time period; and
after reaching the first predetermined temperature and maintaining the first predetermined temperature during a third time, the first predetermined temperature in the processing chamber further rises to a second predetermined temperature; and
placing an electronic product into the processing chamber;
operating the controller to respectively increase the temperature and the pressure in the processing chamber to the first predetermined temperature and the first predetermined pressure; and
operating the controller so that the pressure in the processing chamber rises continuously before the temperature in the processing chamber rises to the first predetermined temperature,
wherein the material processing apparatus further comprises a cooler, disposed between the processing chamber and the pressure reducer, adapted for cooling a gas extracted from the processing chamber, and the gas cooled by the cooler is configured to flow back to the processing chamber for circulation.

10. The operating method of the material processing apparatus according to claim 9, wherein the material processing apparatus further comprises at least one motor, disposed outside the processing chamber and coupled to the processing chamber.

11. The operating method of the material processing apparatus according to claim 10, wherein the at least one motor is located in an atmospheric environment.

12. The operating method of the material processing apparatus according to claim 10, wherein the at least one motor is a plurality of motors, and a part of one of the motors extends into the processing chamber.

13. The operating method of the material processing apparatus according to claim 12, wherein the material processing apparatus further comprises a turbofan, disposed in the processing chamber and connected to the temperature regulator and one of the motors.

14. The operating method of the material processing apparatus according to claim 10, wherein the at least one motor is one motor, and there is a distance between the motor and the processing chamber.

15. The operating method of the material processing apparatus according to claim 9, wherein the controller is adapted for controlling the pressure in the processing chamber to be no less than a normal pressure.

16. The operating method of the material processing apparatus according to claim 9, wherein the controller is adapted for controlling the pressure reducer not to perform the depressurization action before the temperature in the processing chamber rises to the first predetermined temperature.

* * * * *